US007933574B2

(12) United States Patent
Rofougaran et al.

(10) Patent No.: US 7,933,574 B2
(45) Date of Patent: Apr. 26, 2011

(54) METHOD AND SYSTEM FOR LNA ADJUSTMENT TO COMPENSATE FOR DYNAMIC IMPEDANCE MATCHING

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 704 days.

(21) Appl. No.: 11/941,241

(22) Filed: Nov. 16, 2007

(65) Prior Publication Data

US 2009/0130991 A1 May 21, 2009

(51) Int. Cl.
*H04B 7/00* (2006.01)
*H04K 3/00* (2006.01)
(52) U.S. Cl. ............... 455/248.1; 455/193.1; 455/234.2
(58) Field of Classification Search ............... 455/232.1, 455/234.1–234.2, 248.1, 280, 193.1; 333/17.3, 333/32, 124, 129; 343/822, 852, 860–861
See application file for complete search history.

(56) References Cited

U.S. PATENT DOCUMENTS

| 6,236,866 | B1 * | 5/2001 | Meyer et al. | ............... 455/562.1 |
| 7,738,850 | B2 * | 6/2010 | Byun | ............... 455/280 |
| 2004/0251960 | A1 * | 12/2004 | Macedo | ............... 330/51 |

* cited by examiner

*Primary Examiner* — Lee Nguyen
(74) *Attorney, Agent, or Firm* — McAndrews, Held & Malloy, Ltd.

(57) ABSTRACT

Aspects of a method and system for LNA adjustment to compensate for dynamic impedance matching are provided. In this regard, an antenna matching network may be configured to maximize received signal strength for a determined frequency and an amplifier gain may be adjusted based on the maximized signal strength such that output levels of the amplifier are between specified limits. The antenna matching network may be programmatically controlled via one or more switching elements. The amplifier gain may be programmatically controlled via one or more bias points. The antenna matching network may be configured for a plurality of frequencies in a frequency band, such as an FM broadcast band, and a configuration for each frequency may be stored. Accordingly, when the receiver is tuned to a frequency, a corresponding configuration may be retrieved from memory.

24 Claims, 7 Drawing Sheets

METHOD AND SYSTEM FOR LNA ADJUSTMENT TO COMPENSATE FOR DYNAMIC IMPEDANCE MATCHING

CROSS-REFERENCE TO RELATED APPLICATIONS/INCORPORATION BY REFERENCE

Not Applicable

FIELD OF THE INVENTION

Certain embodiments of the invention relate to wireless communications. More specifically, certain embodiments of the invention relate to a method and system for low noise amplifier (LNA) adjustment to compensate for dynamic impedance matching.

BACKGROUND OF THE INVENTION

With the increasing popularity of various wireless standards and technologies, there is a growing demand to provide a simple and complete solution for wireless communications applications. In this regard, electronics manufacturers are increasingly attempting to incorporate multiple wireless technologies into portable electronic devices. For example, wireless technologies that are seeing widespread deployment include FM radio, Bluetooth (BT), Global Positioning System (GPS), Wi-Fi, and radio-frequency identification (RFID).

Although desirable to users, incorporating multiple wireless communication technologies into devices such as wireless handsets may pose problems in terms of cost and complexity. In this regard, combining a plurality of wireless technologies into a portable electronic device may require separate processing hardware and/or separate processing software. Moreover, coordinating the reception and/or transmission of data to and/or from the portable electronic device may require significant processing overhead that may impose certain operation restrictions and/or design challenges. Additionally, the device may need to be highly configurable in order to reduce size and cost by sharing hardware.

As an example, consider integrating FM radio systems into a portable device such as a smart phone. In this regard, conventional FM broadcast radios have relatively large antennas, which may not be practical for incorporating into a device such as a smart phone. Accordingly, system designers are faced with the challenge of receiving a relatively broad FM broadcast band utilizing an antenna which is electrically very small. In this regard, it may be difficult to reliably and/or consistently match an FM broadcast radio to a relatively small antenna as is typically found in a portable wireless device. Furthermore, the frequency response of such an electrically small antenna may be incapable and or inefficient at receiving a broad frequency band, such as the FM broadcast band.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for LNA adjustment to compensate for dynamic impedance matching, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for LNA adjustment to compensate for dynamic impedance matching. In this regard, an antenna matching network may be configured to maximize received signal strength for a determined frequency and an amplifier gain may be adjusted based on the maximized signal strength such that output levels of the amplifier are between specified limits. The antenna matching network may be programmatically controlled via one or more switching elements. The amplifier gain may be programmatically controlled via one or more bias points. The antenna matching network may be configured for a plurality of frequencies in a frequency band, such as an FM broadcast band, and a configuration for each frequency may be stored. Accordingly, when tuning the receiver to a frequency, a corresponding configuration may be retrieved from memory.

Figure 1:
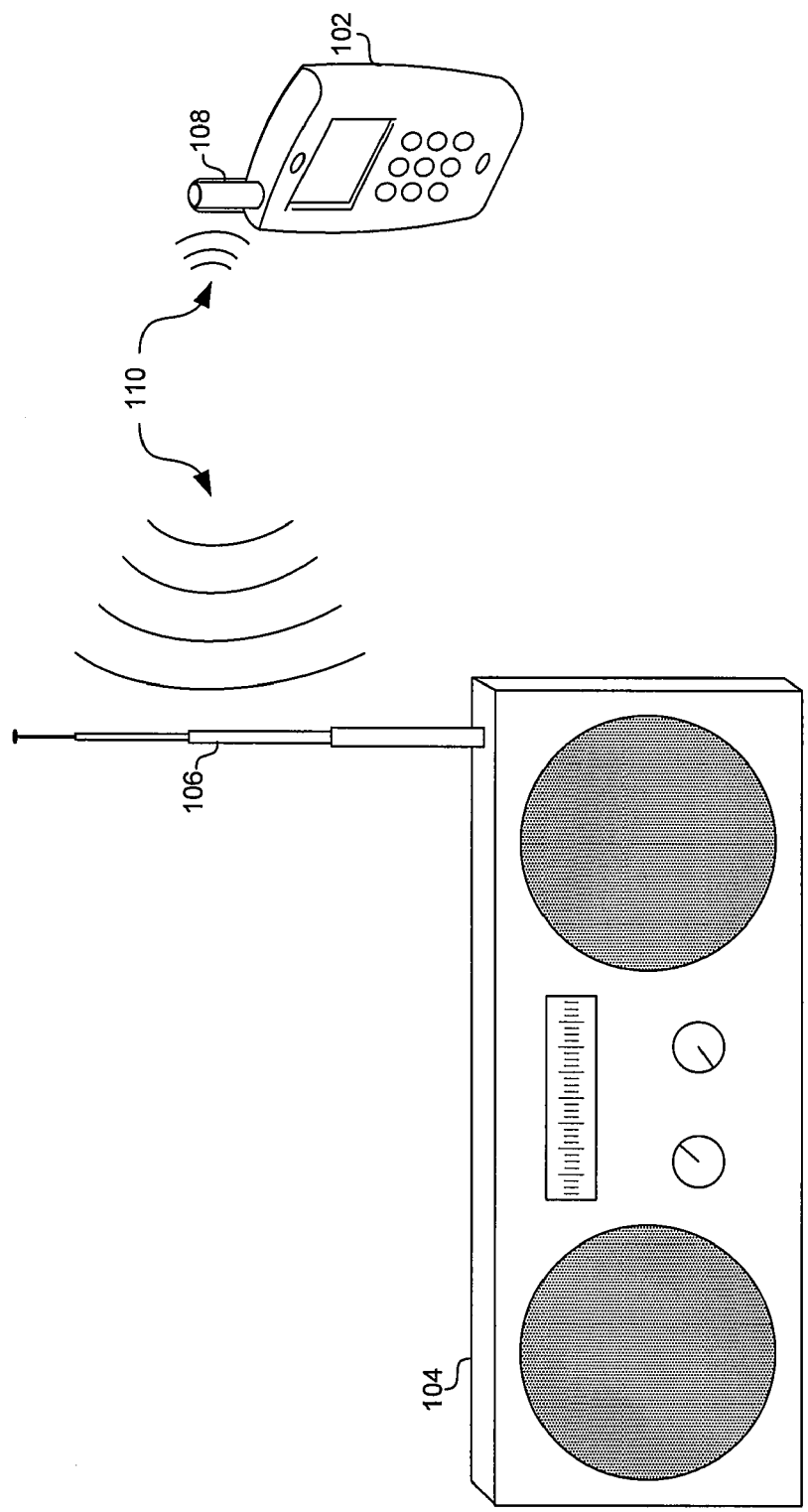
FIG. 1 depicts a conventional FM broadcast radio antenna in comparison to a smart phone antenna which may be utilized for receiving FM broadcast signals, in accordance with an embodiment of the invention.

FIG. 1 depicts a conventional FM broadcast radio antenna in comparison to a smart phone antenna which may be utilized for receiving FM broadcast signals, in accordance with an embodiment of the invention. Referring to FIG. 1, there is shown a communication device 104 with antenna 106, a smart phone 102 with antenna 108, and an FM broadcast signal 110.

The communication device 104 may be enabled to receive, demodulate, detect, and present audio signals in the FM broadcast band. In many instances, the antenna 106 may be several feet long and its length may comprise a significant percentage of the wavelength of a signal in the FM broadcast band. Consequently, the electrically large antenna 106 may be enabled to couple a significant amount of energy from the signal 110 into the communication device 104 over the entire FM broadcast band. In this manner, the communication device 104 may be enabled to receive the entire FM broadcast band without adjusting the antenna or associated circuitry.

The smart phone 102 may also be enabled to receive, demodulate, detect, and present audio signals in the FM broadcast band. However, due at least in part to its small size, the antenna 108 may need tuning or adjustment to sufficiently couple the signal 110 to the smart phone 102 over the entire FM broadcast band. Accordingly, the smart phone 102 may comprise, for example, a matching network that, in effect, enables tuning the frequency response of the antenna. However, as described below with respect to FIG. 2A, adjusting a matching network to alter the frequency response of the antenna may result in received signal strength varying over the range of frequencies. Accordingly, aspects of the invention may enable adjusting the gain of an LNA to compensate for variations in signal strength over frequency. In this manner, an FM broadcast receiver in the smart phone 102 may be presented with uniform signal strength over the entire FM broadcast band.

Figure 2A:
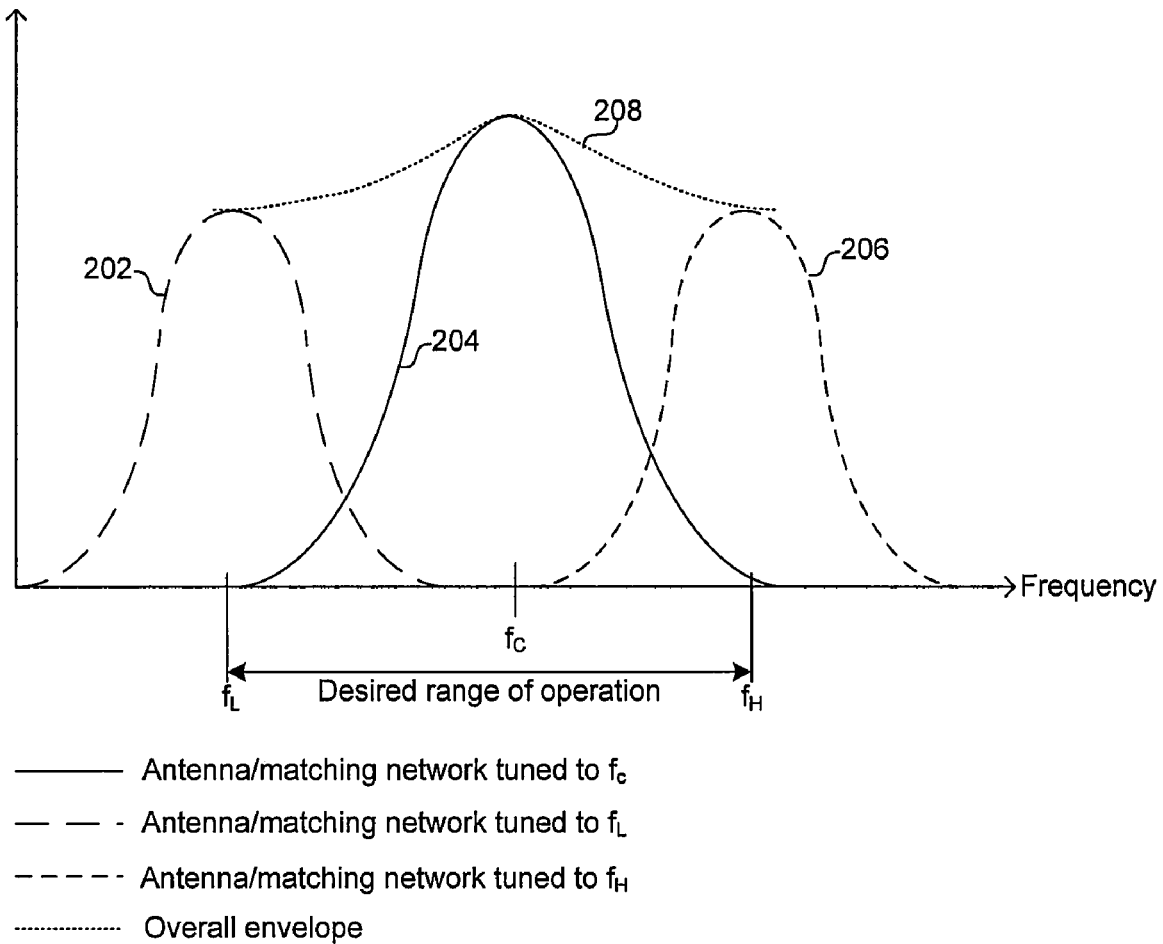
FIG. 2A is a diagram illustrating an exemplary frequency response of an antenna and tuning the antenna to cover a broad frequency band, in connection with an embodiment of the invention.

FIG. 2A is a diagram illustrating an exemplary frequency response of an antenna and tuning the antenna to cover a broad frequency band, in connection with an embodiment of the invention. Referring to FIG. 2A there is shown a graph illustrating the response of an antenna such as the antenna 108 described in FIG. 1. In this regard, waveform 202 may be the frequency response of the antenna 108 when an associated matching network tunes the antenna to be entered at $f_L$. Waveform 204 may be the frequency response of the antenna 108 when an associated matching network tunes the antenna to be centered at $f_C$. Waveform 206 may be the frequency response of the antenna 108 when an associated matching network tunes the antenna to be entered at $f_H$. In this regard, as illustrated by the overall envelope 208, the antenna and associated circuitry may exhibit varying gain over the desired range of frequencies. Accordingly, if coupled to a constant gain LNA, signals received by the antenna 108 of FIG. 1 may result in the LNA output varying widely with frequency. In this manner, components such as a mixer, coupled to the LNA output may need to handle signals of widely varying signal strength. Consequently, complexity and cost of receiver components may increase. Accordingly, aspects of the invention may enable adjusting the gain of the LNA in order to compensate for the frequency dependence of the antenna and associated circuitry, thus reducing cost and complexity of downstream receiver components.

Figure 2B:
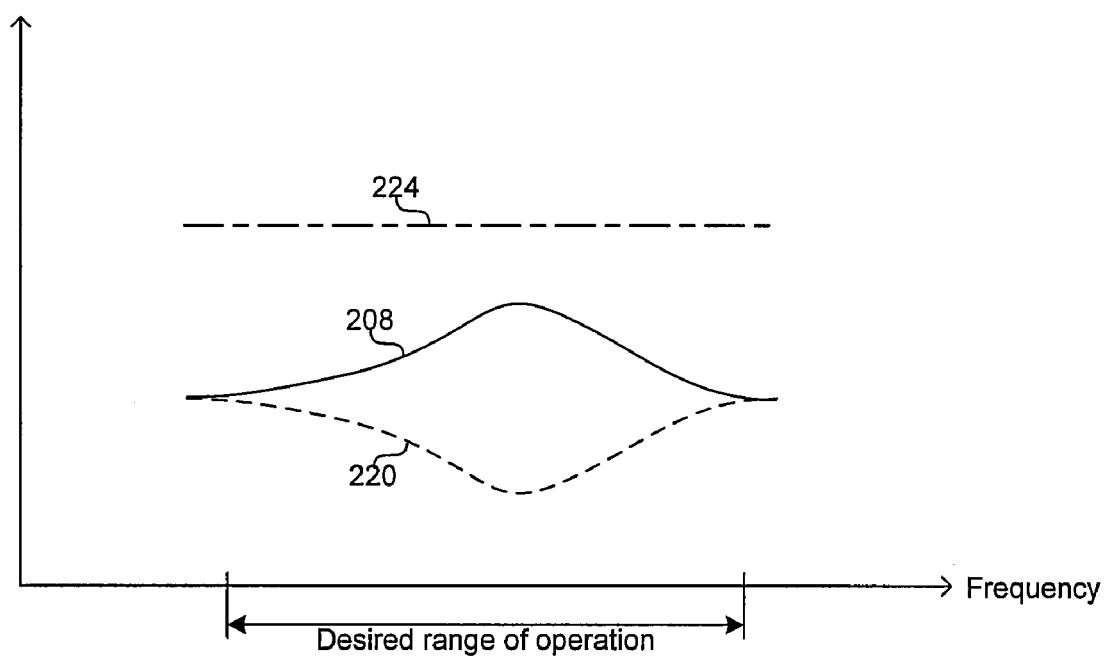
FIG. 2B is a diagram illustrates gain adjustment of an LNA to compensate for gain variations in an antenna and/or a matching circuit, in accordance with an embodiment of the invention.

FIG. 2B is a diagram illustrating gain adjustment of an LNA to compensate for gain variations in an antenna and/or a matching circuit, in accordance with an embodiment of the invention. Referring to FIG. 2B, there is shown the signal envelope 208, as described with respect to FIG. 2A, an LNA gain characteristic 220, and a compensated LNA output 224.

In operation, an antenna and associated antenna tuning circuitry may have the frequency response 208. Accordingly, an LNA to which the antenna and/or antenna tuning circuitry are coupled may be adjusted such that the gain over frequency is as depicted by the waveform 220. In this manner, the gain of the LNA may compensate for the frequency response of the antenna and associated antenna tuning circuitry such that the output of the LNA may be uniform in amplitude over the range of operation as illustrated by the waveform 224.

Figure 3A:
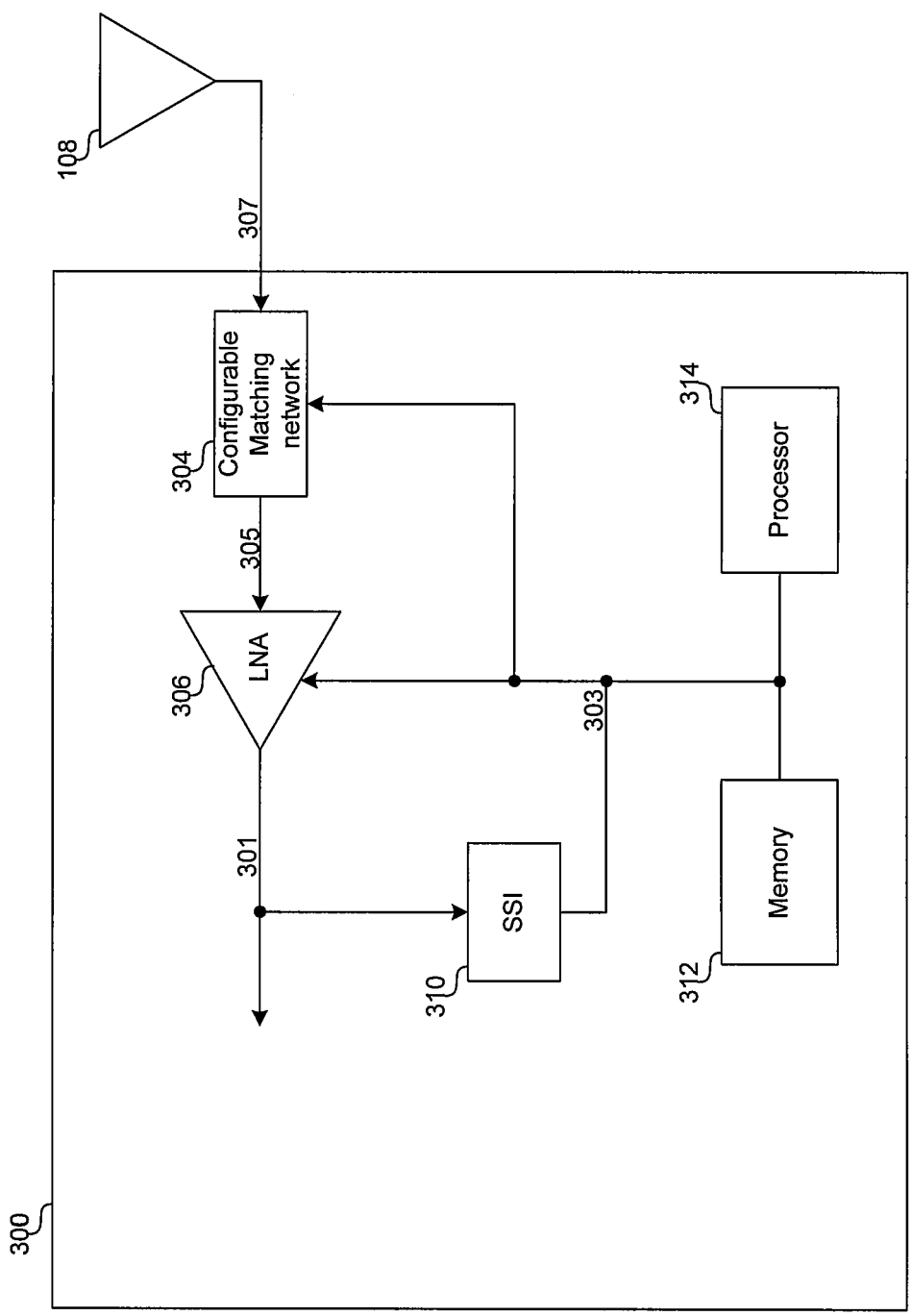
FIG. 3A is a block diagram of an exemplary system enabled to adjust an LNA to compensate for gain variations, in accordance with an embodiment of the invention.

FIG. 3A is a block diagram of an exemplary system enabled to adjust an LNA to compensate for gain variations, in accordance with an embodiment of the invention. Referring to FIG. 3A there is shown system 300 coupled to an antenna 108. The system 300 may comprise a configurable matching network 304, an LNA 306, a signal strength indicator (SSI) 310, a memory 312, and a processor 314.

The antenna 108 may be as described with respect to FIG. 1. In this regard, the antenna 108 may be electrically short with respect to FM broadcast wavelengths. Accordingly, the antenna 108 may exhibit a frequency response similar to that depicted in FIG. 2A. Likewise, the configurable matching network 304 may enable altering the frequency response, as shown in FIG. 2A, to enable the antenna 108 to receive signals across the FM broadcast band.

The configurable matching network (CMN) 304 may comprise suitable logic, circuitry, and/or code that may enable matching the system 300 to the antenna 108 over a range of frequencies. In this regard the matching network 304 may comprise one or more active components, passive components, and/or switching elements. In one embodiment of the invention, the matching network may comprise an LC network with one or more variable capacitances and/or inductances. In this regard the variable capacitance may be a bank of capacitors configured via a number of switching elements. Similarly, the variable inductance may be a bank of inductors configured via a number of switching elements.

The LNA 306 may comprise suitable logic, circuitry, and/or code that may enable amplification of received RF signals. In this regard, the gain of the LNA 306 may be adjustable to enable reception of signals of varying strength. The LNA 306 may receive one or more control signals from the processor 314 and/or the memory 312. The gain of the LNA 306 may be controlled based on strength of the signal 305 output from the configurable matching network 304. Accordingly, the gain of the LNA may be adjusted over frequency, as depicted in FIG. 2B, in order to compensate for variations over frequency of the strength of signal 305, and maintain the signal 301 with determined limits. In various embodiments of the invention, the gain may be adjusted via one or more bias voltages and/or currents. For example, a binary weighted current source may bias one or more transistors comprising the LNA 306. An exemplary embodiment comprising bias network 320 and 322 is described with respect to FIG. 3C.

The SSI 310 may comprise suitable logic, circuitry, and/or code that may enable determining signal levels. In this regard, the SSI 310 may, for example, be enabled to measure current, voltage and/or power of the signal 301. Additionally, the SSI 310 may be enabled to convey measurement results to the memory 312 and/or the processor 314 via the bus 303. In various embodiments of the invention, the SSI 310 may output one or more digital and/or analog signals representative of the current, voltage and/or power of the signal 301.

The memory 312 may comprise suitable logic, circuitry, and/or code that may enable storing control/configuration information for the system 300. In this regard, the memory may store information for determining and/or controlling the gain of the LNA 306 and/or the configuration of the configurable matching network 304. For example, the memory may store a table or similar data structure with data records comprising LNA gain and CMN configuration indexed by desired frequency of operation of the system 300.

The processor 314 may comprise suitable logic, circuitry, and/or code that may enable controlling operations of the system 300. In this regard, the processor 314 may provide control/configuration signals to the CMN 304, the LNA 306, the SSI 310, and/or the memory 312. Additionally, the processor 314 may enable data transfers between the CMN 304, the LNA 306, the SSI 310, and/or the memory 312 via the bus 303.

In an exemplary operation, the CMN 304 may be configured to tune the antenna to a desired frequency. In this regard, configuration of the CNM 304 may be performed by maximizing the strength of the received signal utilizing the SSI 310 with the LNA 306 set to a fixed gain. Moreover, configuration may be controlled by the processor 314, which may read and/or write information pertaining to the configuration from/to the memory 312. Once the received signal is maximized with the LNA 306 set to a fixed gain, the gain of the LNA 306 may be adjusted such that signal 301 is brought within determined limits.

Figure 3B:
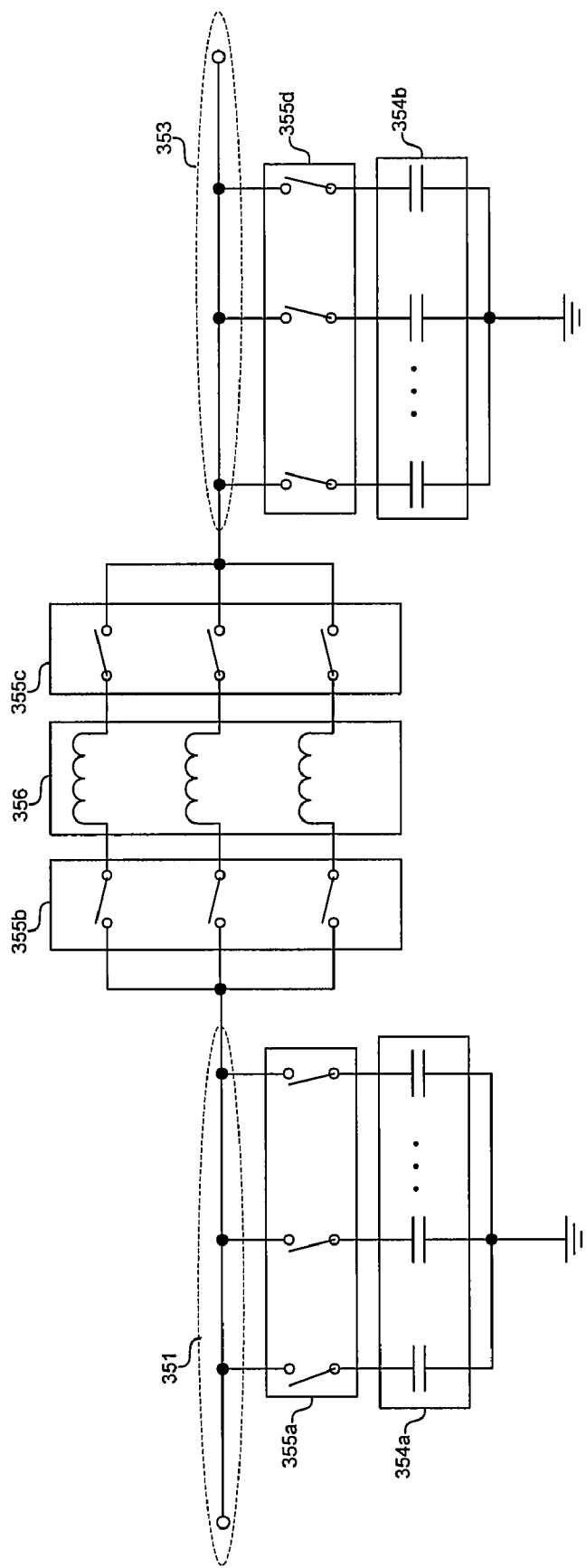
FIG. 3B is a diagram of an exemplary matching network, in accordance with an embodiment of the invention.

FIG. 3B is a diagram of an exemplary matching network, in accordance with an embodiment of the invention. Referring to FIG. 3B there is shown two banks of capacitors 354a and 354b with corresponding switch networks 355a, 355d, and a bank of inductors 356 with corresponding switch networks 355b and 355c. Each of the switch networks 355 may comprise a plurality of switches which may be controlled via a digital word, for example. In this regard the capacitance between node 351 and ground may be programmatically controlled. Similarly the capacitance between node 353 and ground may be programmatically controlled. Also, the inductance between nodes 351 and 353 may be configured. Accordingly, the configurable matching network 304 may enable matching, for example, the input of the LNA 306 to the antenna 108 over a range of frequencies.

Figure 3C:
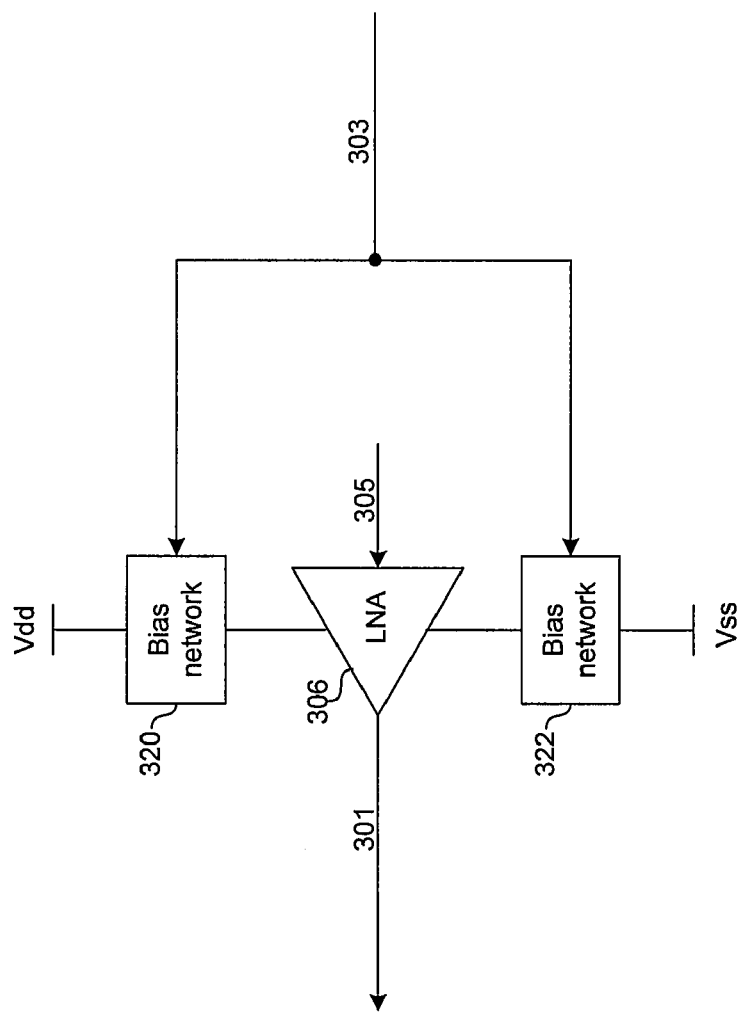
FIG. 3C is a block diagram illustrating an exemplary biasing arrangement of an LNA, in accordance with an embodiment of the invention.

FIG. 3C is a block diagram illustrating an exemplary biasing arrangement of an LNA, in accordance with an embodiment of the invention. Referring to FIG. 3C, there is shown the LNA 306 and bias networks 320 and 322.

The bias networks 320 and 322 may each comprise suitable logic, circuitry, and or code that may enable controlling a voltage and/or current provided to the LNA 306. In this manner, one or more control signals received via the bus 303 may control the voltage and/or current. Moreover, the gain of the LNA 306 may be dependant on the voltage and/or current.

Figure 4:
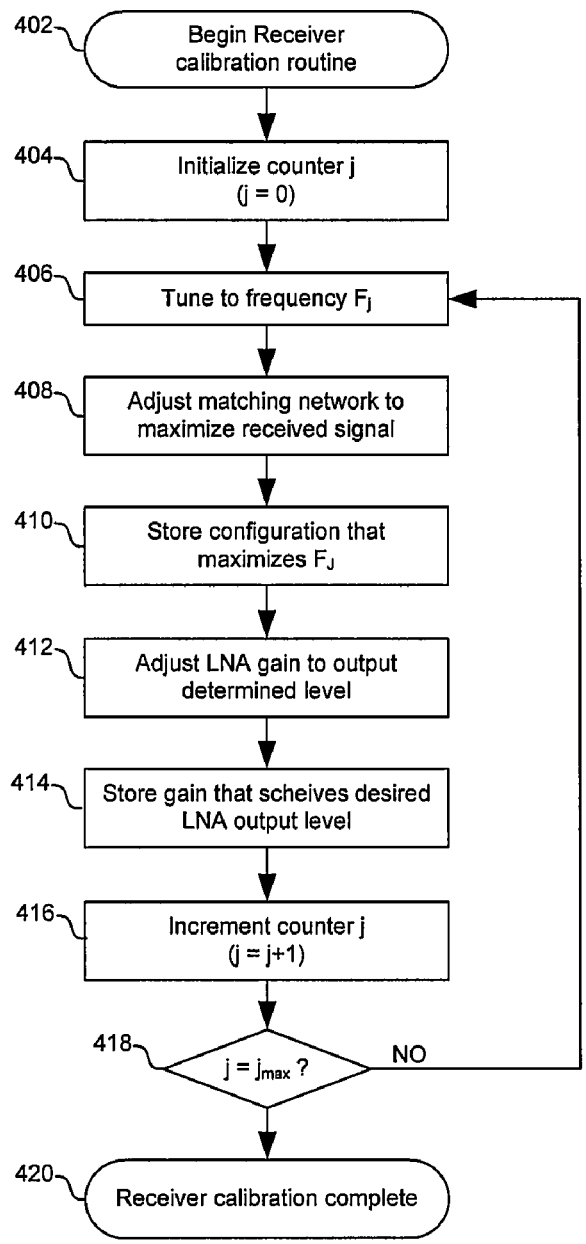
FIG. 4 is a flowchart illustrating exemplary steps for adjusting an LNA to compensate for gain variations in a signal received from a dynamically impedance matched antenna, in accordance with an embodiment of the invention.

FIG. 4 is a flowchart illustrating exemplary steps for adjusting an LNA to compensate for gain variations in a signal received from a dynamically impedance matched antenna, in accordance with an embodiment of the invention. Referring to FIG. 4, the exemplary steps may begin with step 402 when the system 300 begins a calibration routine. Subsequent to step 402, the exemplary steps may advance to step 404. In step 404, a counter 'j' may be initialized to 0. The counter 'j' may determine the number of frequencies at which the receiver is calibrated. Subsequent to step 404, the exemplary steps may advance to step 406.

In step 406, the receiver may be tuned to a frequency $F_j$. For example, for an FM broadcast receiver, $F_0$ may be 87.5 MHz and $F_{jmax}$ may be 108 MHz. Subsequent to step 406 the exemplary steps may advance to step 408. In step 408, the CMN 304 may be adjusted to maximize the signal 305 input to the LNA 306. In this regard, the CMN 304 may be tuned such that the frequency response of the antenna 108 and CMN 304 is centered at $F_j$. In this regard, the processor 314 may configure the LNA for a fixed gain and utilize readings from the SSI 310 to adjust the CMN 304 for maximum signal strength. Subsequent to step 408, the exemplary steps may advance to step 410.

In step 410, the configuration resulting in maximum signal strength for frequency $F_j$ may be stored to the memory 312. Subsequent to step 410 the exemplary steps may advance to step 412. In step 412, the LNA 306 may be adjusted such that the signal 301 is within determined limits. In this regard, in instances where a relatively strong signal may be received from the CMN 304, then the gain of the LNA 306 may be adjusted to be relatively small. Conversely, in instances where a relatively weak signal may be received from the CMN 304, the gain of the LNA 306 may be adjusted to be relatively large. Subsequent to step 412, the exemplary steps may advance to step 414.

In step 414, the LNA gain resulting in the signal 301 within determined limits for frequency $F_j$ may be stored to the memory 312. Subsequent to step 414 the exemplary steps may advance to step 416. In step 416, the counter 'j' may be incremented. Subsequent to step 414, the exemplary steps may advance to step 418. In step 418, it may be determined if 'j' is equal to a maximum value. In this regard, the maximum value of 'j' may correspond to a number of frequencies at which the receiver may be calibrated. If 'j' is not equal to a maximum value, then the exemplary steps may return to step 406. If 'j' equal to a maximum value, then the calibration routine may be complete and the exemplary steps may advance to step 420.

Aspects of a method and system for LNA adjustment to compensate for dynamic impedance matching are provided. In this regard, the antenna matching network 304 (FIG. 3A) may be configured to maximize received signal strength for a determined frequency and the amplifier 306 gain may be adjusted based on the maximized signal strength such that output levels of the amplifier 306 are between specified limits. The antenna matching network 304 may be programmatically controlled (e.g., by the processor 312 and/or the memory 314) via one or more switching elements 355 (FIG. 3B). The amplifier gain may be programmatically controlled via one or more bias points controlled, in turn, by one or more bias networks 320, 322 (FIG. 3A). The antenna matching network 304 may be configured for a plurality of frequencies in a frequency band, such as an FM broadcast band, and a configuration for each frequency may be stored in the memory 312. Accordingly, when tuning the receiver 300 to a frequency, a corresponding configuration may be retrieved from the memory 314.

Another embodiment of the invention may provide a machine-readable storage, having stored thereon, a computer program having at least one code section executable by a machine, thereby causing the machine to perform the steps as described herein for LNA adjustment to compensate for dynamic impedance matching.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
performing, by one or more processors and/circuits:
configuring an antenna matching network in a receiver to maximize received signal strength for a determined frequency; and
adjusting a gain of an amplifier within said receiver based on said maximized signal strength such that output levels of said amplifier are between specified limits.

2. The method according to claim 1, comprising programmatically controlling said antenna matching network by one or more signals that control one or more switching elements.

3. The method according to claim 1, comprising programmatically adjusting said gain of said amplifier by controlling one or more bias points.

4. The method according to claim 1, comprising configuring said antenna matching network for a plurality of frequencies in a frequency band.

5. The method according to claim 4, comprising storing a result of said configuring for each of said plurality of frequencies.

6. The method according to claim 5, comprising retrieving said stored result for a frequency when tuning to said frequency.

7. The method according to claim 1, comprising retrieving stored configuration data from a memory to configure said antenna matching network.

8. The method according to claim 1, wherein said determined frequency is within an FM broadcast band.

9. A machine-readable storage having stored thereon, a computer program having at least one code section for signal processing, the at least one code section being executable by a machine for causing the machine to perform steps comprising:
configuring an antenna matching network in a receiver to maximize received signal strength for a determined frequency; and
adjusting a gain of an amplifier within said receiver based on said maximized signal strength such that output levels of said amplifier are between specified limits.

10. The machine-readable storage according to claim 9, wherein said at least one code section comprises code that programmatically controls said antenna matching network by one or more signals that control one or more switching elements.

11. The machine-readable storage according to claim 9, wherein said at least one code section comprises code that programmatically adjusts said gain of said amplifier by controlling one or more bias points.

12. The machine-readable storage according to claim 9, wherein said at least one code section comprises code that configures said antenna matching network for a plurality of frequencies in a frequency band.

13. The machine-readable storage according to claim 12, wherein said at least one code section comprises code that stores a result of said configuring for each of said plurality of frequencies.

14. The machine-readable storage according to claim 13, wherein said at least one code section comprises code that retrieves said stored result for a frequency when tuning to said frequency.

15. The machine-readable storage according to claim 9, wherein said at least one code section comprises code that retrieves stored configuration data from a memory to configure said antenna matching network.

16. The machine-readable storage according to claim 9, wherein said determined frequency is within an FM broadcast band.

17. A system for signal processing, the system comprising:
one or more circuits that:
configure an antenna matching network in a receiver to maximize received signal strength for a determined frequency; and
adjust a gain of an amplifier within said receiver based on said maximized signal strength such that output levels of said amplifier are between specified limits.

18. The system according to claim 17, wherein said one or more circuits programmatically control said antenna matching network by one or more signals that control one or more switching elements.

19. The system according to claim 17, wherein said one or more circuits programmatically adjust said gain of said amplifier by controlling one or more bias points.

20. The system according to claim 17, wherein said one or more circuits configuring said antenna matching network for a plurality of frequencies in a frequency band.

21. The system according to claim 20, wherein said one or more circuits comprises a memory that stores a result of said configuring for each of said plurality of frequencies.

22. The system according to claim 21, wherein said one or more circuits retrieve said stored result from said memory for a frequency when tuning to said frequency.

23. The system according to claim 17, wherein said one or more circuits retrieve stored configuration data from a memory to configure said antenna matching network.

24. The system according to claim 17, wherein said determined frequency is within an FM broadcast band.

* * * * *